(12) United States Patent
Chen et al.

(10) Patent No.: US 7,676,775 B2
(45) Date of Patent: Mar. 9, 2010

(54) METHOD TO DETERMINE THE ROOT CAUSES OF FAILURE PATTERNS BY USING SPATIAL CORRELATION OF TESTER DATA

(75) Inventors: Howard Chen, Yorktown Heights, NY (US); Katherine V. Hawkins, Hyde Park, NY (US); Fook-Luen Heng, Yorktown Heights, NY (US); Louis Hsu, Fishkill, NY (US); Xu Ouyang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 234 days.

(21) Appl. No.: 11/754,947

(22) Filed: May 29, 2007

(65) Prior Publication Data

US 2008/0301597 A1    Dec. 4, 2008

(51) Int. Cl.
*G06F 17/50* (2006.01)
(52) U.S. Cl. .................. 716/4; 716/19; 716/21
(58) Field of Classification Search ........... 716/5, 716/19–21, 4; 430/5, 30
See application file for complete search history.

(56) References Cited

U.S. PATENT DOCUMENTS

| | | | |
|---|---|---|---|
| 5,544,308 A | 8/1996 | Giordano et al. | |
| 6,219,626 B1 | 4/2001 | Steinmetz et al. | |
| 6,466,895 B1 * | 10/2002 | Harvey et al. | ............... 702/181 |
| 6,477,685 B1 * | 11/2002 | Lovelace | ..................... 716/4 |
| 6,564,346 B1 | 5/2003 | Vollrath et al. | |
| 6,708,306 B2 | 3/2004 | Bartenstein et al. | |
| 6,721,914 B2 | 4/2004 | Bartenstein et al. | |
| 6,842,866 B2 * | 1/2005 | Song et al. | ..................... 714/37 |
| 7,003,432 B2 * | 2/2006 | Wohlfahrt et al. | ........... 702/183 |
| 7,047,469 B2 * | 5/2006 | Chiu | ......................... 714/732 |
| 7,229,845 B1 * | 6/2007 | Luu et al. | ..................... 438/16 |
| 7,415,386 B2 * | 8/2008 | Burch et al. | ................ 702/183 |
| 2006/0226847 A1 | 10/2006 | Fure et al. | |
| 2007/0156379 A1 * | 7/2007 | Kulkarni et al. | ............... 703/14 |

FOREIGN PATENT DOCUMENTS

| | | |
|---|---|---|
| JP | 7209383 A | 8/1995 |
| JP | 7211619 A | 8/1995 |
| JP | 2003037143 A | 2/2003 |

* cited by examiner

*Primary Examiner*—Paul Dinh
*Assistant Examiner*—Nha T Nguyen
(74) *Attorney, Agent, or Firm*—George Willinghan; August Law, LLC

(57) ABSTRACT

A method for determining the root causes of fail patterns in integrated circuit chips is provide wherein a known integrated circuit chip layout is used to identify a plurality of potential defects and a plurality of potential fail patterns in the integrated circuit chip. Correlations between the potential defects and the potential fail patterns that result from those defects are identified. Based on this identification, the potential fail patterns are grouped by common potential defect. An actual integrated circuit chip that is manufactured in accordance with the test layout is tested for failure patterns. These failure patterns are then compared to the groupings of potential fail patterns. When a match is found, that is when a given group of fail patterns is found in the actual integrated circuit chip, then the potential defect associated with the potential fail patterns to which the actual fail patterns are matched is identified. This defect is the root cause of the failure pattern in the actual chip.

13 Claims, 5 Drawing Sheets

| Potential Defects | Potential Fail Patterns | | | | | | | | | | |
|---|---|---|---|---|---|---|---|---|---|---|---|
| | SCF | QUAD | HPC | VPC | PS | FBL | PBL | Pair BL | FWL | PWL | Pair WL | Cross |
| RX short | x | x | x | x | x | | | x | | | | |
| RX open | x | | x | x | | | | | | | | |
| CA open | x | | x | x | | | ? | | | | | |
| CAREC open/shorts | x | | | | | | | | | | | |
| CA-PC shorts | x | x | x | x | | x | | | | | | |
| PC short | x | x | x | x | x | x | x | | | | | |
| PC open | x | | | x | | | | | | | | |
| M1 short | x | | x | | | | x | | | | | |
| M1 open | x | | x | | | | | | x | ? | x | x |
| V1 open | | | | | | | | | | ? | x | x |
| M2 short | | | x | | | | | | | ? | | |
| M2 open | | | | | | | | | | | | x |
| V2 open | | | | | | | | | | | | |
| M3 short | | | | | | | | | x | | | |
| M3 open | | | | | | | | | | x | | |

*Fig. 2*

Possible root causes of fail patterns

SCF and PF failures caused by CA contact open defects

Using bit fail map to find local correlation of fail patterns

METHOD TO DETERMINE THE ROOT CAUSES OF FAILURE PATTERNS BY USING SPATIAL CORRELATION OF TESTER DATA

FIELD OF THE INVENTION

The present invention relates to testing of semiconductor circuits. More particularly, the present invention relates to a method and system of determining the root causes of fail patterns by utilizing the spatial correlation information of fail patterns and the layout information of the circuits.

BACKGROUND OF THE INVENTION

One of the main methods of improving circuit yield during the development or manufacturing of integrated circuits is to study the fail patterns uncovered by a tester used to test a given integrated circuit. If fail patterns could be used to disclose important information about their root causes or the nature of the defects, corrective actions could then be taken to improve the yield, based on the knowledge of such defects gained from such analysis, either from the process side or the design side.

Existing methods for analyzing semiconductor fail patterns are developed from the memory bit fail maps. Unlike logic circuits, memory chips can easily provide the exact X, Y coordinates of each memory cell. Therefore, memory chips have been used more extensively in fail pattern analysis than logic circuits. One example of a yield analysis tool is disclosed in U.S. Pat. No. 6,564,346. Although fail patterns from the tester data of memory circuits are searched, classified and analyzed, each fail pattern is classified individually without regard to the local correlation among the fail patterns.

SUMMARY OF THE INVENTION

The present invention is directed to a method for determining the root causes of fail patterns in integrated circuit chips. Initially for a given integrated circuit chip layout, a plurality of potential defects are identified in the given integrated circuit chip layout, and a plurality of potential fail patterns are identified in the given integrated circuit chip layout. Identification of the plurality of potential defects includes using layout connectivity information from the integrated circuit chip layout to identify the potential defects. Correlations between the identified potential defects and identified potential fail patterns are identified, and these correlations are used to identify groupings of potential fail patterns and potential defects. Each grouping includes one potential defect and one or more potential fail patterns. For an actual integrated circuit chip that is to be tested, actual fail patterns are identified in the integrated circuit chip. These actual fail patterns are compared to the identified groupings of potential fail patterns and potential defects to identify actual defects in the integrated circuit chip.

In one embodiment, identification of the plurality of potential fail patterns includes determining fail patterns that can be caused by the identified plurality of potential defects. Identification of the correlations between potential defects and potential fail patterns includes associating each potential fail pattern with all potential defects that are potential root causes of that potential fail pattern. Use of the correlations to identify groupings of potential fail patterns includes identifying potential fail patterns that can result from the same defect. Identification of actual fail patterns includes searching bit fail maps associated with the integrated circuit chip.

In one embodiment, use of the groupings of potential fail patterns and potential defects to identify actual defects includes grouping the actual fail patterns according to spatial correlations across the integrated circuit chip, matching the groupings of actual fail patterns to the groupings of fail patterns and potential defects and identifying potential defects associated with the groupings of potential fail patterns and potential defects to which the groupings of actual defects are matched. In one embodiment, the spatial correlations include areas of the integrated circuit chip. In one embodiment, the spatial correlations correspond to the entire integrated circuit chip.

In one embodiment, the method also includes determining a total number of each potential defect that can occur in the integrated circuit chip arrangement, and using the total numbers to calculate a probability of occurrence of each potential failure pattern. In one embodiment, the potential defects include breaks or short circuits within the circuitry of the integrated circuit chip arrangement.

BRIEF DESCRIPTION OF THE DRAWINGS

FIG. 2 is a table summarizing an embodiment of the layout analysis of a SRAM showing the correspondence between defects and fail patterns;

DETAILED DESCRIPTION

Figure 1:
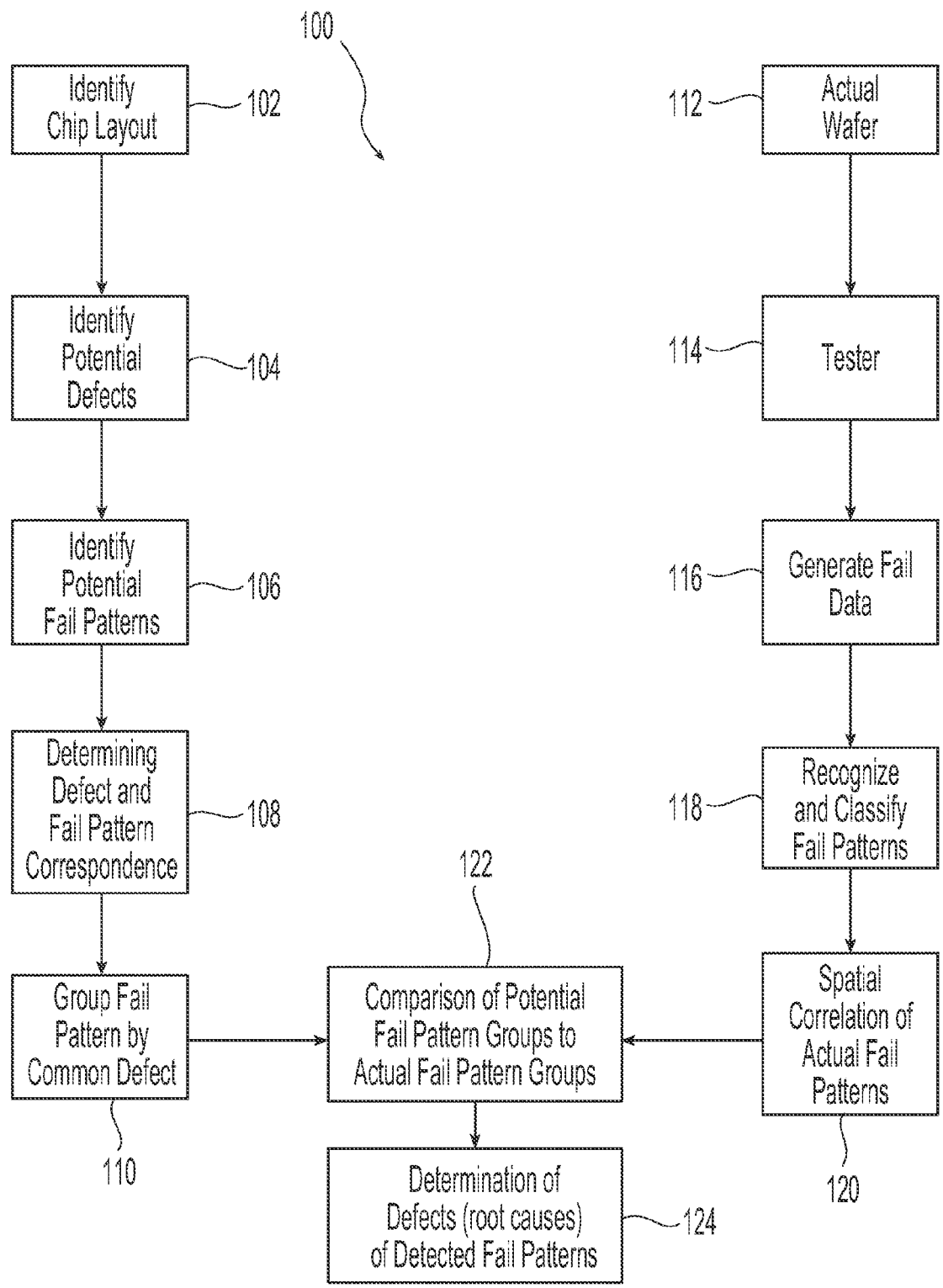
FIG. 1 is a schematic representation of an embodiment of a method to identify the root causes of failure patterns by using spatial correlation of tester data in accordance with the present invention.

Systems and methods in accordance with the present invention correlate fail patterns in an integrated circuit chip or wafer with defect locations in that chip or wafer to identify the root cause of such fail patterns and to improve integrated circuit manufacturing yield. Referring initially to FIG. 1, an exemplary embodiment of a system 100 for the identification of defects that are the root cause of fail patterns in an integrated circuit chip in accordance with the present invention is illustrated. As illustrated, a known layout for each integrated circuit chip that is to be manufactured is identified 102. This layout is derived, for example, from a schematic used in the manufacture of the integrated circuit chip. The known layout for each integrated circuit chip is analyzed, and potential defects that can occur in the layout are identified 104. These manufacturing defects could cause open circuits and short circuits on the device and interconnect layers, for example on the silicon layer RX, polysilicon layer PC, contact layer CA, metal layers M1, M2, M3 and via layers V1, V2. In addition to defects, potential fail patterns in the integrated circuit chip layout are identified 106. Common fail patterns on memory chips may involve single cell (SCF), quadruple cells (QUAD), horizontal pair (HP), vertical pair (VP), bit line (BL), word line (WL) and one bit line crosses one word line (Cross) failures.

The identified defects are the roots causes of the fail patterns. Stated another way, the fail patterns are the functional manifestations of the underlying defects in the integrated circuit chip. Therefore, identification of fail patterns is used to identify actual defects in the integrated circuit chip. In order to use the fail patterns to derive the defects, correspondences between fail patterns and defects are required. In one embodiment, the desired correspondences are obtained by identifying correspondences between the identified potential defects and the identified potential fail patterns in the integrated circuit chip layout 108. A given fail pattern can result from different defects. In addition, a given defect in an integrated circuit chip can manifest as one or more fail patterns. In one embodiment, potential defects are grouped by the common failure patterns associated with the defects. Preferably, the potential fail patterns are grouped according to a common defect 110.

A given grouping of potential fail patterns and the associated common potential defect that is the root cause of the all of the fail patterns in the group is associated with the integrated circuit chip layout from which the potential fail patterns and potential defect were derived. Each integrated circuit chip layout can have a plurality of associated groupings of potential fail patterns. Therefore, all potential fail patterns that can result from a given defect are grouped together. In one embodiment, these groups are saved to a persistent storage location to be used any time that an integrated circuit chip is created in accordance with the integrated circuit chip layout. The groupings are used to determine the likely root causes, i.e., the defects, associated with observed fail patterns in actual integrated circuit chip wafers that are tested. Fail patterns with common potential root causes will show local correlation if their common root causes are the dominant failure mechanisms in a related technology or product.

Having established groupings of potential fail patterns and common potential defects for an integrated circuit chip layout, these groupings are used in the testing and analysis of actual integrated circuit chips manufactured in accordance with the layout. A production integrated circuit chip 112 is placed in a suitable tester 114 that analyzes the wafer and produces fail data 116. Suitable testers and resulting fail data are known and available in the art. For example, a programmable tester can be used to perform the functional and parametric testing of dynamic random access memory (DRAM), static random access memory (SRAM), video random access memory (VRAM) and single in-line memory module (SIMM) devices. Memory cells that failed a specific test are shown as black squares on a bit fail map, while memory cells that passed the test are shown as white squares (402 in FIG. 4). The fail data generated by the tester are used to identify actual fail patterns in the integrated circuit chip wafer 118. In one embodiment, a plurality of actual fail patterns are recognized from the fail data. In order to utilize the groupings of potential fail patterns to identify defects, the actual fail patterns are grouped 120. In one embodiment, the actual fail patterns are grouped in accordance with spatial correlations in the tested integrated circuit chip wafer. The size of the spatial correlation can be varied from groupings that cover the entire wafer to local correlations of groupings that cover single circuits, components, i.e., transistor, or connectors in the integrated circuit. In one embodiment, the spatial correlations cover a prescribed area of the tested wafer.

The groupings of the actual fail patterns are compared to the potential fail pattern groupings 122, and matches are identified. From the potential fail pattern groupings that match the actual fail pattern groupings, defects, i.e., underlying root causes, for the actual fail patterns are obtained 124. In particular, the identified defects are the potential defects associated with the potential fail pattern groupings with which the actual fail patterns are matched. Therefore, systems and methods in accordance with the present invention provide for a more accurate identification of defects in integrated circuit chips than existing systems that do not consider the correlation of fail patterns. In one embodiment, the steps of actual fail pattern recognition, actual fail pattern grouping, comparison of actual groupings to potential groupings and the identification of defects are performed by the tester. Alternatively, a separate dedicated or general purpose computing system is used to handle the analysis.

Yield analysis and physical failure analysis (PFA) in a 45 nm-technology silicon on insulator static random access memory (SOI SRAM) was performed using methods for the determination of root causes of fail patterns in accordance with the present invention. Initially, an extensive SRAM layout analysis was performed to determine the potential defect-related failure mechanisms, i.e., defects, on all active and metal interconnect layers and to determine potential SRAM fail patterns that might be induced by the potential failure mechanisms. Referring to FIG. 2, a table 200 illustrates the relationship among the potential fail patterns 202 in the SRAM and the potential defects 204. As illustrated, any given potential defect can be the root cause of one or more potential fail patterns. Therefore, a given fail pattern can be caused by one or more defects. All of the potential fail patterns caused by a given defect are a grouping of fail patterns caused by the associated defect. Therefore, even though a given fail pattern can be caused by more than one defect, when that fail pattern appears in combination with a given grouping, then the actual defect causing that fail pattern can be determined. For example, a contact open defect 206 is associated with the potential fail pattern grouping of single cell failure (SCF) 208, vertical pair of cells failure (VPC) 212 and a horizontal pair of cells failure (HPC) 210. In the actual SRAM being tested, these fail patterns would be spatially coordinated within the prescribed parameters.

Figure 3:
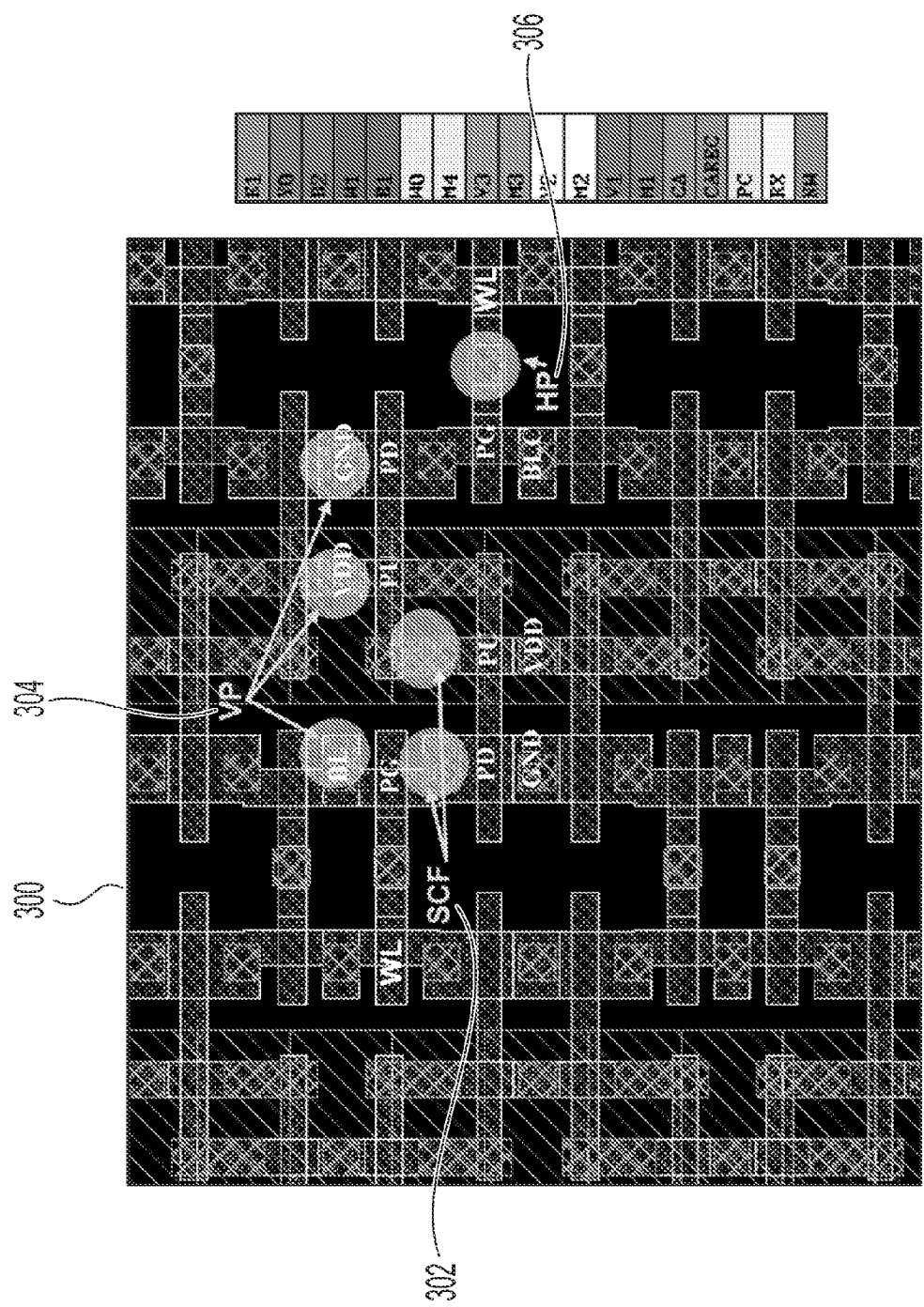
FIG. 3 is an illustration of an embodiment of a layout analysis of SRAM cells showing that contact open defects can cause both single cell failure (SCF) and vertical pair failure (VP)

Referring to FIG. 3, details of the SRAM layout 300 are illustrated. These details show how contact-open defects, i.e., CA open, cause the plurality of fails patterns in the groupings associated with the contact-open defect. Depending on the actual contact on which the defect is landing on, the defect can cause a single cell to fail (SCF) 302, a vertical pair of cells to fail (VP) 304 or a horizontal pair of cells to fail (HP) 306. Although different fail patterns may not occur simultaneously in the same cell, the CA open defect could cause all three types of failures in an expanded region that includes multiple cells. In general, in only one fail pattern were present in a specific chip area, it would be difficult to identify the root cause as there could be multiple potential defects that might cause the same fail pattern. However, if a plurality of fail patterns were present in a specific chip area, then the number of potential defects that could cause such combination of failures would be greatly reduced.

Figure 5:
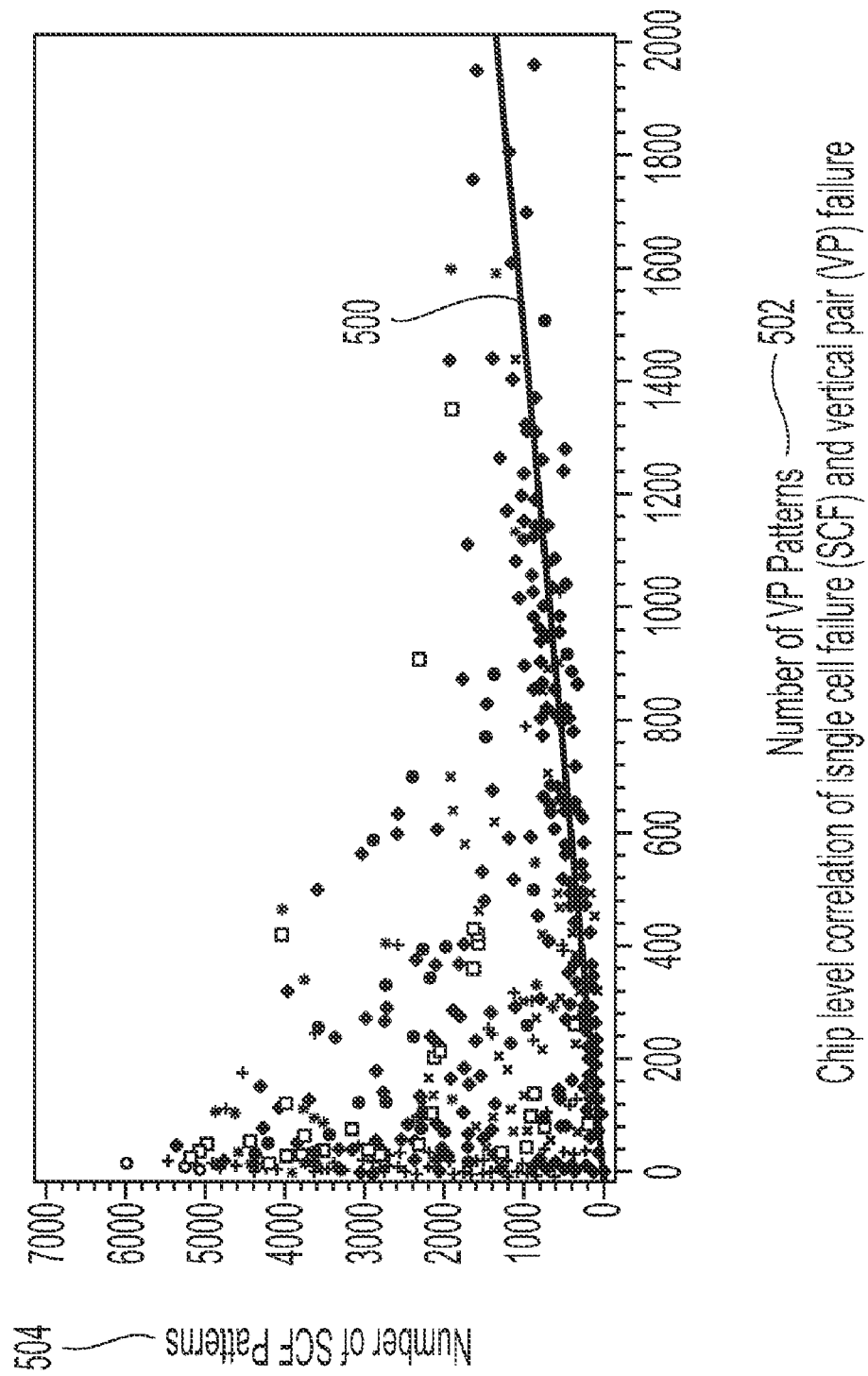
FIG. 5 is a graph showing an embodiment of the total numbers of vertical pair failures and single cell failures on an integrated circuit chip.

By counting the number of contacts corresponding to the occurrence of each one of the fail patterns in the entire SRAM design, the failing probability of each fail pattern is calculated. In addition, ratios of probabilities of occurrence of each one of the failing patterns associated with a given defect are calculated. As illustrated, the fail probability ratio of an SCF failure pattern occurrence to a VP failure pattern occurrence is 2:3 for the SRAM layout illustrated. In one embodiment, this ratio of SCF failure pattern occurrence to a VP failure pattern occurrence is used to identify the root cause of such failures when the chip-level correlation of SCF to VP in the actual chip also yields a 2:3 ratio (FIG. 5). In one embodiment, the layout analysis can be enumerated with layout connectivity information. After the layout connectivity information is extracted from the design layout, it can be used to simulate fail patterns by enumerating all possible breakages and shorts. This enumeration technique can be used to generate potentially correlated fail patterns. It can also be used to identify potential root causes after correlated fail patterns are observed in tester data. In contrast to a traditional manual layout analysis, the use of layout connectivity information to enumerate potential defects provides an automatic means and complete coverage to correlate to fail patterns with their potential root causes (FIG. 2).

Figure 4:
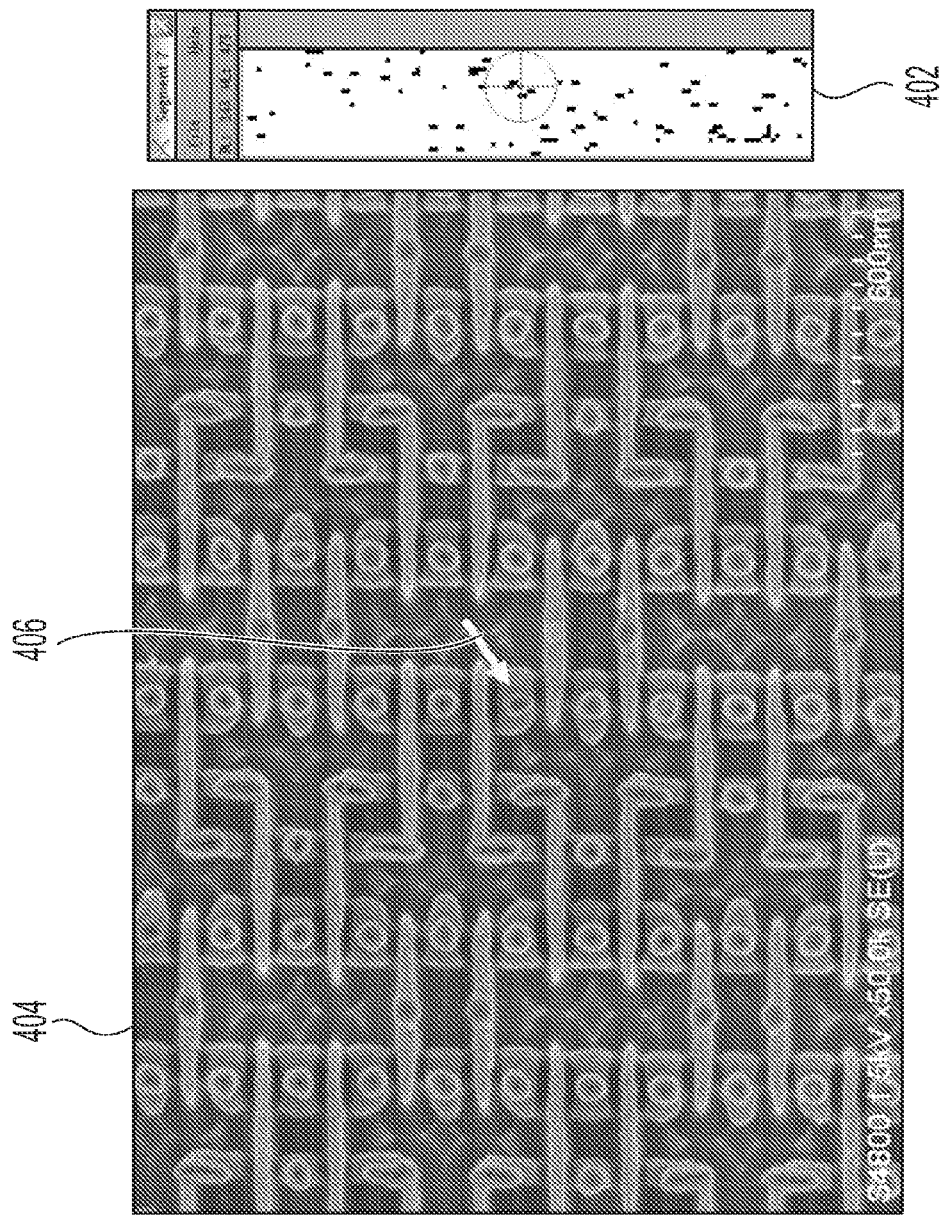
FIG. 4 is an illustration of an embodiment of the local correlation between SCF and VP failures clustered in some regions.

Having established potential defects and groupings of potential fail patterns associated with these root causes as illustrated in FIG. 2, local spatial correlations of these groups of fail patterns, for example, SCF and VP, that have common root causes are identified in an actual SRAM that is tested. In this embodiment, only two of the three failure patterns in a given group are used, because the horizontal pair (HP) failures do not occur as frequently in certain chips, for example in certain SRAM technologies. Therefore, the exact arrangement and grouping of defects can be varied based upon the type of integrated circuit ship being tested. The local correlation of fail patterns can be identified by a comprehensive search in the SRAM bit fail maps. Referring to FIG. 4, the bit fail map 402 of an SRAM chip where SCF and VP failures are found to be locally correlated is illustrated. Since SCFs and VPs are locally clustered together, these fail patterns are likely to share the same root cause in the regions of the SRAM chip where these clusters occur. To confirm this hypothesis, these regions of the chip are polished and etched down to the poly/active/contact layers through the de-layering process. As shown in the scanning electron microscope image representation 404 of the tested SRAM chip, a contact 406 was found to be failing at the location of the single cell failure (SCF). In particular, the scanning electron microscope image shows that the failing contact is smaller than other contacts. Therefore, the voltage contrast of this contact differs from the voltage contrasts of all the other contacts. In the physical failure analysis of other vertical pair (VP) failures, similar contact open defects were found. The SCF and VP failures show strong local correlation, indicating a correspondence to the same contact open root cause.

In one embodiment, the local correlations of fail patterns are extended to the chip level for further yield analysis or confirmation of the results found in local regions. Referring to FIG. 5, the correlation between SCF and VP failures, where the x-axis is the number of VP patterns in each chip 502 and the y-axis is the number of SCF patterns in each chip 504, is illustrated for a variety of SRAM wafers. Some wafers show strong correlation between SCF and VP, with a ratio of 2:3 along the correlation line 500, which is consistent with the layout analysis. This finding strongly indicates that these wafers have been affected by the same contact open problems found in physical failure analysis.

While the present invention has been particularly described in conjunction with a specific preferred embodiment, it is evident that many alternatives, modifications and variations will be apparent to those skilled in the art in light of the present description. It is therefore contemplated that the appended claims will embrace any such alternatives, modifications and variations as falling within the true scope and spirit of the present invention.

Methods and systems in accordance with exemplary embodiments of the present invention can take the form of an entirely hardware embodiment, an entirely software embodiment or an embodiment containing both hardware and software elements. In a preferred embodiment, the invention is implemented in software, which includes but is not limited to firmware, resident software and microcode. In addition, exemplary methods and systems can take the form of a computer program product accessible from a computer-usable or computer-readable medium providing program code for use by or in connection with a computer, logical processing unit or any instruction execution system. For the purposes of this description, a computer-usable or computer-readable medium can be any apparatus that can contain, store, communicate, propagate, or transport the program for use by or in connection with the instruction execution system, apparatus, or device. Suitable computer-usable or computer readable mediums include, but are not limited to, electronic, magnetic, optical, electromagnetic, infrared, or semiconductor systems (or apparatuses or devices) or propagation mediums. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

Suitable data processing systems for storing and/or executing program code include, but are not limited to, at least one processor coupled directly or indirectly to memory elements through a system bus. The memory elements include local memory employed during actual execution of the program code, bulk storage, and cache memories, which provide temporary storage of at least some program code in order to reduce the number of times code must be retrieved from bulk storage during execution. Input/output or I/O devices, including but not limited to keyboards, displays and pointing devices, can be coupled to the system either directly or through intervening I/O controllers. Exemplary embodiments of the methods and systems in accordance with the present invention also include network adapters coupled to the system to enable the data processing system to become coupled to other data processing systems or remote printers or storage devices through intervening private or public networks. Suitable currently available types of network adapters include, but are not limited to, modems, cable modems, DSL modems, Ethernet cards and combinations thereof.

In one embodiment, the present invention is directed to a machine-readable or computer-readable medium containing a machine-executable or computer-executable code that when read by a machine or computer causes the machine or computer to perform a method for determining root causes of fail patterns in integrated circuit chips in accordance with exemplary embodiments of the present invention and to the computer-executable code itself. The machine-readable or computer-readable code can be any type of code or language capable of being read and executed by the machine or computer and can be expressed in any suitable language or syntax known and available in the art including machine languages, assembler languages, higher level languages, object oriented languages and scripting languages. The computer-executable code can be stored on any suitable storage medium or database, including databases disposed within, in communication with and accessible by computer networks utilized by systems in accordance with the present invention and can be executed on any suitable hardware platform as are known and available in the art including the control systems used to control the presentations of the present invention.

While it is apparent that the illustrative embodiments of the invention disclosed herein fulfill the objectives of the present invention, it is appreciated that numerous modifications and other embodiments may be devised by those skilled in the art. Additionally, feature(s) and/or element(s) from any embodiment may be used singly or in combination with other embodiment(s) and steps or elements from methods in accordance with the present invention can be executed or performed in any suitable order. Therefore, it will be understood that the appended claims are intended to cover all such modifications and embodiments, which would come within the spirit and scope of the present invention.

What is claimed is:

1. A method for determining root causes of fail patterns in integrated circuit chips, the method comprising:
    identifying, by using a computer, a plurality of potential defects that can occur in a given integrated circuit chip layout from a schematic used in the manufacture of the integrated circuit chip;
    identifying, by using the computer, a plurality of potential fail patterns in the given integrated circuit chip layout, the potential fail patterns comprising functional manifestations of defects in the integrated circuit chip;
    identifying, by using the computer, correlations between the identified potential defects and identified potential fail patterns that are root causes of the identified potential fail patterns;
    using the identified correlations to identify groupings of potential fail patterns and potential defects, each grouping comprising one potential defect and one or more potential fail patterns; and
    using the groupings of potential fail patterns and potential defects to identify actual defects in a production integrated circuit chip by:
        placing the production integrated circuit chip in a tester configured to analyze operation of the production integrated circuit chip;
        using the tester to identify actual fail patterns in the production integrated circuit chip;
        correlating the actual fail patterns to the potential fail patterns; and
        using the identified groupings of potential fail patterns and potential defects to identify actual defects in the production integrated circuit chip, wherein the step of using the grouping of potential fail patterns and potential defects to identify actual defects further comprises:
            grouping the actual fail patterns according to spatial correlations across the integrated circuit chip;
            matching the groupings of actual fail patterns to the groupings of potential fail patterns and potential defects; and
            identifying potential defects associated with the groupings of potential fail patterns and potential defects to which the groupings of actual fail patterns are matched.

2. The method of claim 1, wherein the step of identifying the plurality of potential fail patterns further comprises determining fail patterns that can be caused by the identified plurality of potential defects.

3. The method of claim 1, wherein the step of identifying correlations between potential defects and potential fail patterns further comprises associating each potential fail pattern with all potential defects that are potential root causes of that potential fail pattern.

4. The method of claim 1, wherein the step of using the correlations to identify groupings of potential fail patterns further comprises identifying potential fail patterns that can result from the same defect.

5. The method of claim 1, wherein the step of identifying actual fail patterns further comprises searching bit fail maps associated with the integrated circuit chip.

6. The method of claim 1, wherein the spatial correlations comprise areas of the integrated circuit chip.

7. The method of claim 1, wherein the spatial correlations comprise an entire integrated circuit chip.

8. The method of claim 1, further comprising:
    determining a total number of each potential defect that can occur in the integrated circuit chip arrangement; and
    using the total numbers to calculate a probability of occurrence of each potential failure pattern.

9. The method of claim 1, wherein the potential defects comprise breaks or short circuits within the circuitry of the integrated circuit chip layout.

10. The method of claim 1, wherein the step of identifying a plurality of potential defects further comprises using layout connectivity information from the integrated circuit chip layout schematic to identify the potential defects.

11. A method for determining root causes of fail patterns in integrated circuit chips, the method comprising:
    identifying, by using a computer, a plurality of potential defects that can occur in a given integrated circuit chip layout from a schematic used in the manufacture of the integrated circuit chip;
    identifying, by using a computer, a plurality of potential fail patterns in the given integrated circuit chip layout, the potential fail patterns comprising functional manifestations of defects in the integrated circuit chip;
    identifying, by using a computer, correlations between the identified potential defects and identified potential fail patterns that are root causes of the identified potential fail patterns;
    grouping together potential fail patterns that can result from the same potential defect, each grouping comprising one potential defect and one or more potential fail patterns; and
    using the groupings of potential fail patterns and potential defects to identify actual defects in a production integrated circuit chip by:
        placing the production integrated circuit chip in a tester configured to analyze operation of the production integrated circuit chip;
        using the tester to identify actual fail patterns in the production integrated circuit chip;
        grouping the actual fail patterns according to spatial correlations across the production integrated circuit chip;
        matching the groupings of actual fail patterns to the groupings of potential fail patterns and potential defects; and
        identifying potential defects associated with the groupings of potential fail patterns and potential defects to which the groupings of actual fail patterns are matched.

12. The method of claim 11, wherein the spatial correlations comprise areas of the production integrated circuit chip.

13. The method of claim 11, wherein the spatial correlations comprise the entire production integrated circuit chip.

* * * * *